(12) United States Patent
Chen

(10) Patent No.: US 8,196,643 B2
(45) Date of Patent: Jun. 12, 2012

(54) RING HEAT DISSIPATING DEVICE FORMED BY PUNCHING AND RIVETING THROUGH A SHAPING MOLD

(76) Inventor: Shyh Ming Chen, Taipei Hsien (TW)

(*) Notice: Subject to any disclaimer, the term of this patent is extended or adjusted under 35 U.S.C. 154(b) by 622 days.

(21) Appl. No.: 12/356,524

(22) Filed: Jan. 20, 2009

(65) Prior Publication Data
US 2010/0181046 A1 Jul. 22, 2010

(51) Int. Cl.
*F28F 7/00* (2006.01)
(52) U.S. Cl. ................ 165/80.3; 165/128
(58) Field of Classification Search .......... 165/80.3, 165/80.2, 183, 182, 185, 903, 104.33, 128; 29/890.046; 361/700, 704
See application file for complete search history.

(56) References Cited

U.S. PATENT DOCUMENTS

| | | | |
|---|---|---|---|
| 6,707,073 B1 * | 3/2004 | Yamamoto et al. | 257/99 |
| 7,269,013 B2 * | 9/2007 | Chen et al. | 361/700 |
| 2005/0211416 A1 * | 9/2005 | Kawabata et al. | 165/80.3 |
| 2007/0079954 A1 * | 4/2007 | Wang et al. | 165/104.26 |
| 2009/0147520 A1 * | 6/2009 | Liu et al. | 362/294 |
| 2010/0084116 A1 * | 4/2010 | Chen | 165/80.3 |
| 2010/0126697 A1 * | 5/2010 | Huang | 165/80.3 |
| 2011/0226458 A1 * | 9/2011 | Plonski et al. | 165/185 |

* cited by examiner

*Primary Examiner* — Cheryl J Tyler
*Assistant Examiner* — Orlando E Aviles Bosques
(74) *Attorney, Agent, or Firm* — Chun-Ming Shih; HDLS IPR Services

(57) ABSTRACT

A ring heat dissipating device is mainly assembled by a ring body, a bottom plate arranged inside the ring body, and a plurality of heat dissipating fins arranged outside the ring body. The bottom plate is punched by a mold so that the bottom plate is fixed to a predetermined position inside the ring body. The heat dissipating fins are inserted into slots on an outer surface of the ring body. After trenches between the slots are punched and deformed, the heat dissipating fins are tightly riveted by the deformed trenches.

5 Claims, 14 Drawing Sheets

RING HEAT DISSIPATING DEVICE FORMED BY PUNCHING AND RIVETING THROUGH A SHAPING MOLD

FIELD OF THE PRESENT INVENTION

The present invention relates to heat dissipating devices, and particular to an improved structure of combining a ring body, heat dissipating fins, and a bottom plate together by punching and riveting.

DESCRIPTION OF THE PRIOR ART

By the higher and higher performance of the electronics and electrical products, the consumed power is higher as well as heat being generated. To dissipate the heat to stabilize the performance of the electronics becomes an important subject of product design.

Heat dissipation is a very important part in manufacturing of electronic products and electronics. Higher requirements in heat dissipating come with the changing market of advance consuming products. For example, familiar lamps like tungsten lamps and electric bulbs are replaced by light emitting diodes (LEDs) which has advantage of low power consumption, long life time, and high power and others. LEDs are widely used as a lighting device in panels of electric equipments, information screens, and communication products because of the small size, more and more mature production process, and capability of emitting lights with different wave lengths the LED has. It is further applied to desk lights, street lights, and other lighting devices. Normal LED generates lower heat than a prior light device, but the heat dissipation is still an important issue to take care on a high density area or high power LED on a normal poor heat dissipating substrate.

SUMMARY OF THE PRESENT INVENTION

Accordingly, the primary object of the present invention is to provide a ring heat dissipating device which a bottom plate is tight fixed to a ring body by punching and riveting.

A secondary object of the present invention is to simplify and save time of the manufacture by a punching method to assemble the ring body and the heat dissipating fins, and the ring body and the bottom plate.

Another object of the present invention is to raise production speed, reduce errors and troubles, save environment and human body by a punching method with a mold instead of welding or injecting grease for heat conducting.

A yet object of the present invention is to provide the bottom plate made of single or at least two pieces of sheet metal of different materials. Moreover, the bottom plate is fixed to the ring body without entire contact such as concave and protruding edges or petal edges along the edge of the bottom plate. Gaps remain inside the assembly of the ring body and the bottom plate to improve heat dissipating by air convection from environment.

To achieve above object, the present invention provides a ring heat dissipating device formed by punching and riveting through a shaping mold, the ring heat dissipating device comprising: a hollow ring body with a plurality of trenches and slots formed alternatively on an outer surface thereof; a bottom plate arranged inside the ring body; a plurality of heat dissipating fins arranged along an outer surface of the ring body and inserted into the slots of the ring body; wherein by punching through the mold and extruding of a shaping mold, the bottom plate deforms to be fixed inside the ring body and the heat dissipating fins being riveted in the slots by the adjacent trenches so that the ring body, bottom plate, and the heat dissipating fins being tightly combined together.

Through above descriptions, the present invention has the following effects and advantages.

1. Production time and procedures are saved and simplified by combining the bottom plate, ring body, heat dissipating fins together through punching the ring body to fix the heat dissipating fins and punching the bottom plate to fix to the ring body. The material and position of the bottom plate inside the ring body can be adjusted to meet the performance acquired by industrial.

2. The bottom plate is fixed to the ring body without entire contact, heat dissipating effect is improved by the gaps remained between the assembled bottom plate and the ring body.

The various objects and advantages of the present invention will be more readily understood from the following detailed description when read in conjunction with the appended drawing.

DETAILED DESCRIPTION OF THE IVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
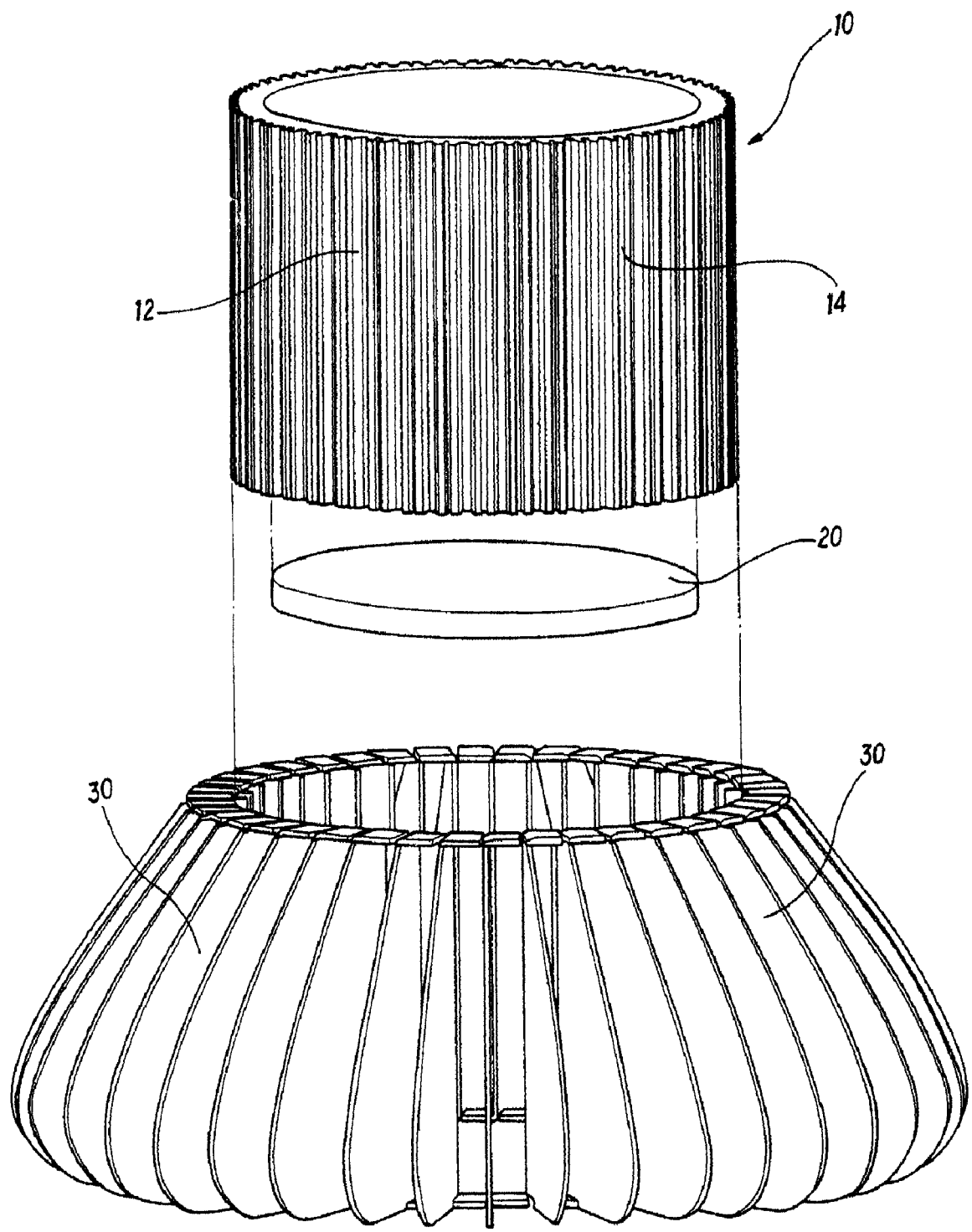
FIG. 1 is an exploded view of the present invention.
Figure 2:
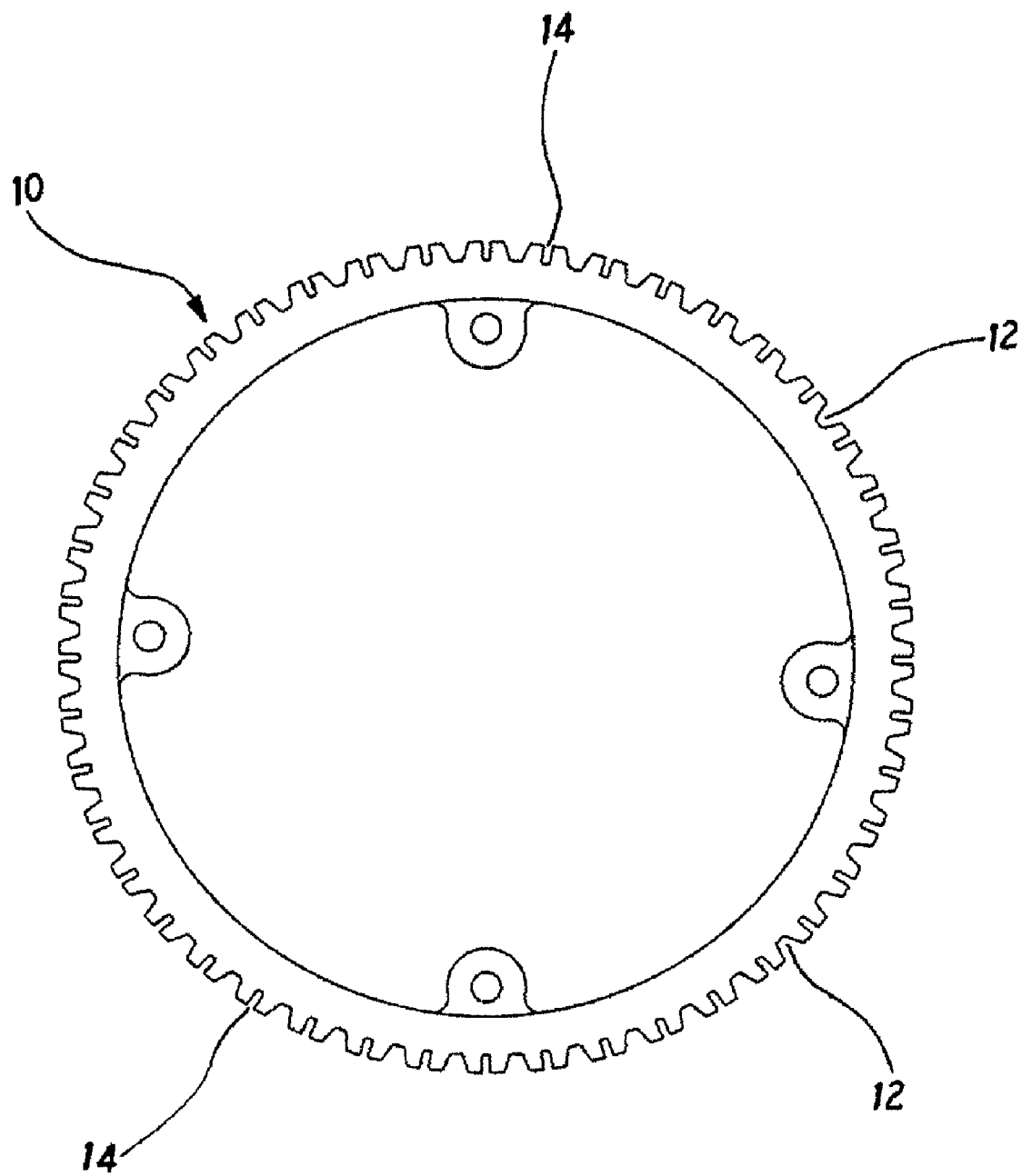
FIG. 2 is a top view of the ring body of the present invention.

Referring to FIG. 1, the present invention is mainly assembled by a ring body 10, a bottom plate 20 arranged inside the ring body 10, and a plurality of heat dissipating fins 30 arranged outside the ring body 10. As shown in FIG. 2, the ring body 10 is a hollow cylinder body with a plurality of trenches 12 and slots 14 formed one next to one on an outer surface thereof. The shape of the ring body 10 is not confined in practice. The material of the bottom plate 20 can be chosen by a metal of well thermal conductivity such as cooper, aluminum, or iron. The bottom plate 20 can made of a single piece of sheet metal, or at least two pieces of sheet metal of same material or different materials. A diameter of the bottom plate 20 is equal to or slightly smaller than an inner diameter of the ring body 10 so that the bottom plate 20 can be installed inside the ring body 10. In some special cases, the diameter of the bottom plate 20 can be slightly larger than the inner diameter of the ring body 10. Such bottom plate 20 is inserted into the ring body 10 at a predetermined angle and being punched and tightly fixed to the ring body 10 through a mold 4. However, the heat dissipating fins 30 are arranged to fit the slots 14 in advance so that the fins 30 are tightly and precisely riveted to the slots 14 during an assembling process.

Figure 3:
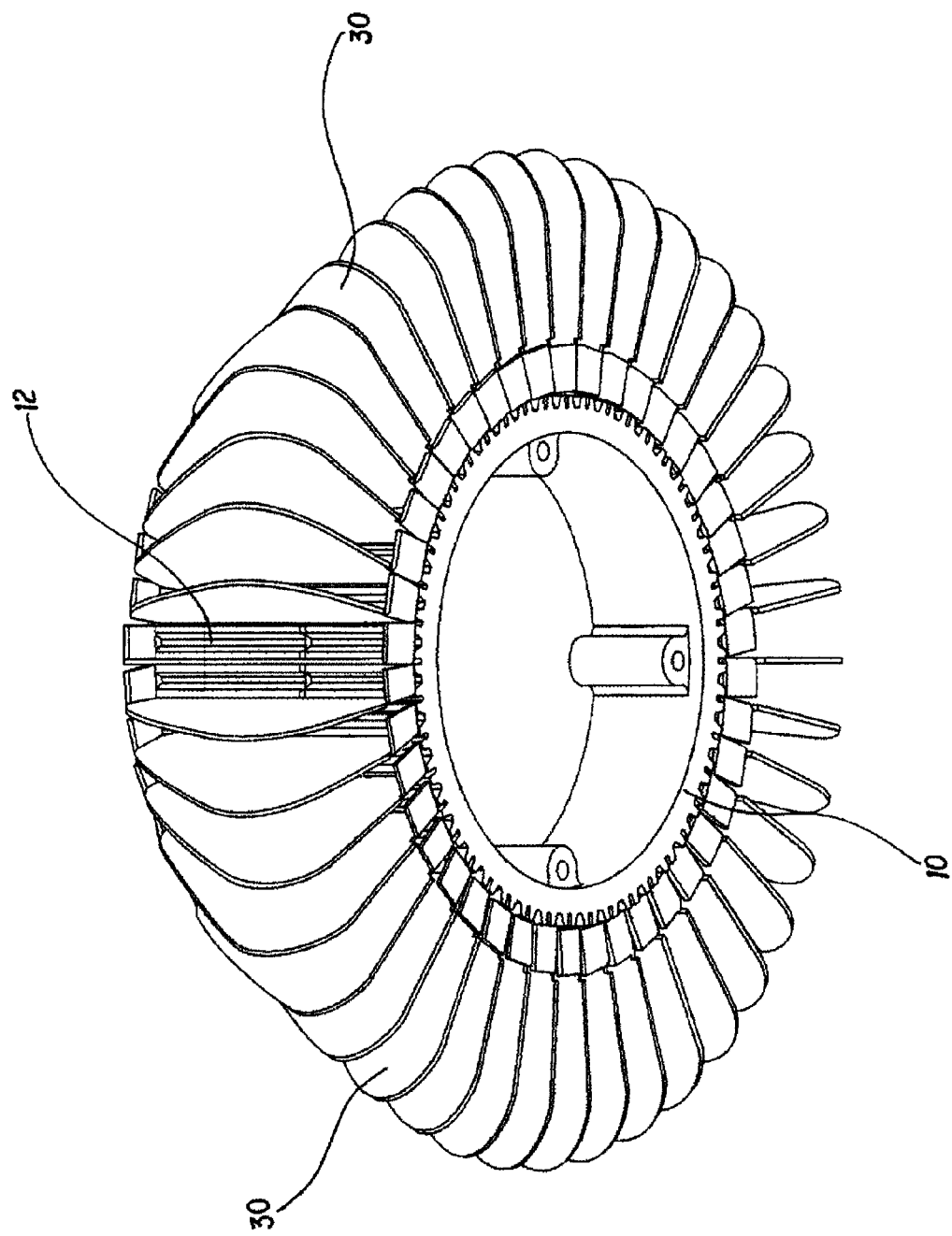
FIG. 3 is a schematic view showing an assembling of heat dissipating fins and a bottom plate of the present invention.
Figure 4:
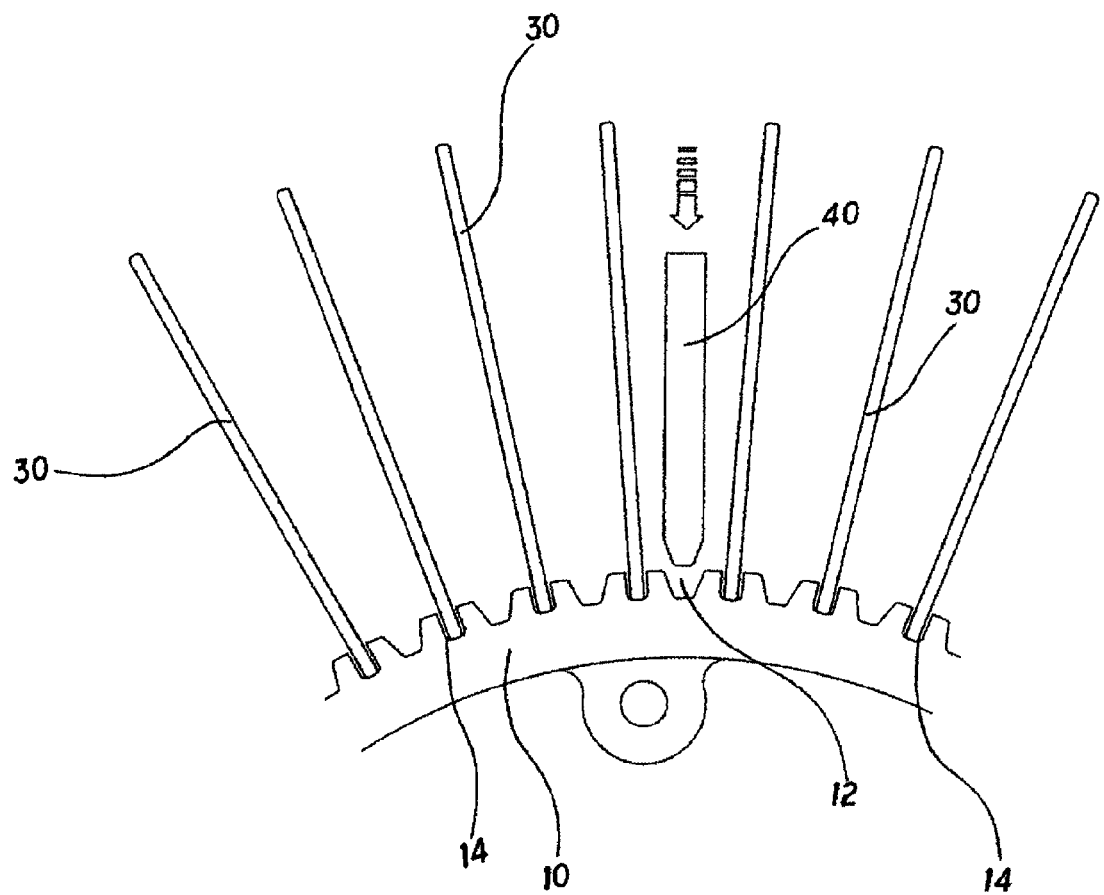
FIG. 4 is a schematic view showing a punching process of the ring body and the heat dissipating fins according to the present invention.
Figure 5:
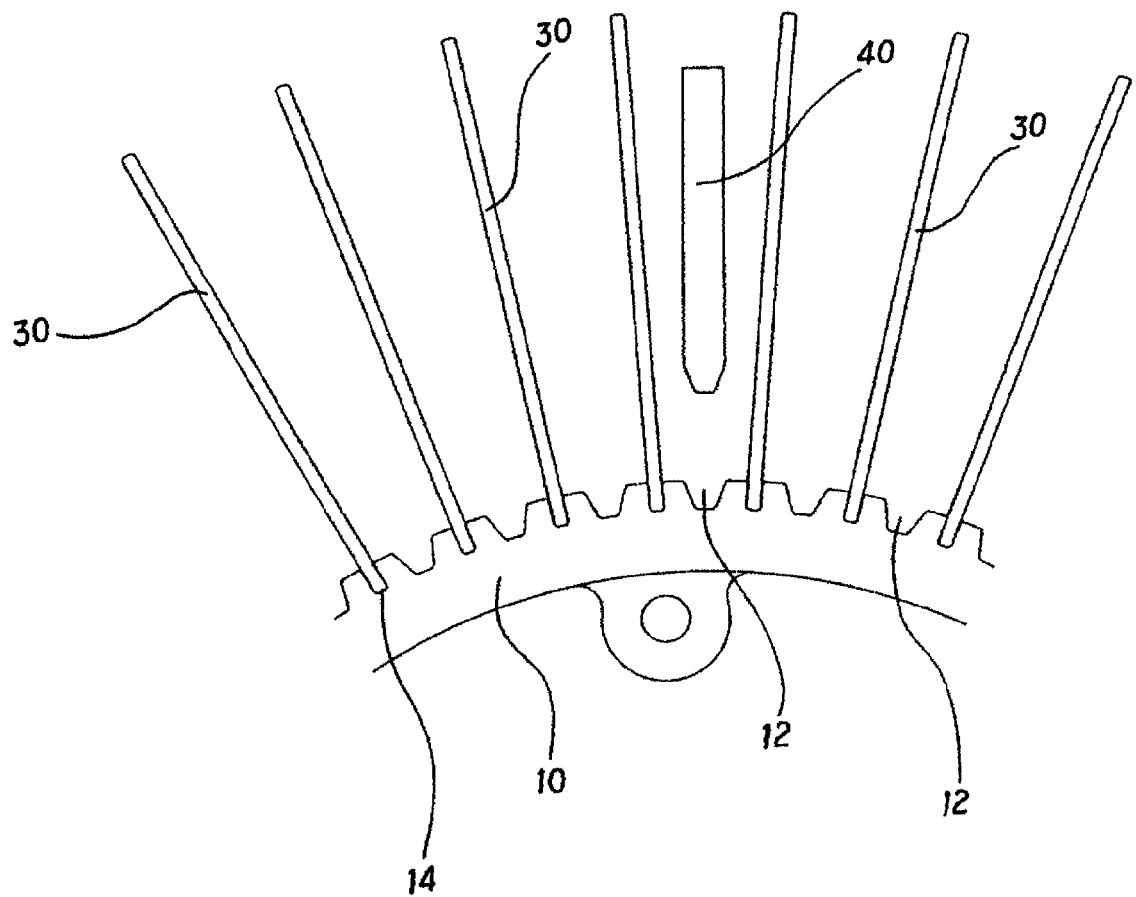
FIG. 5 is a schematic view showing the tightly combined heat dissipating fins and the ring body after the punching process of the present invention.
Figure 8:
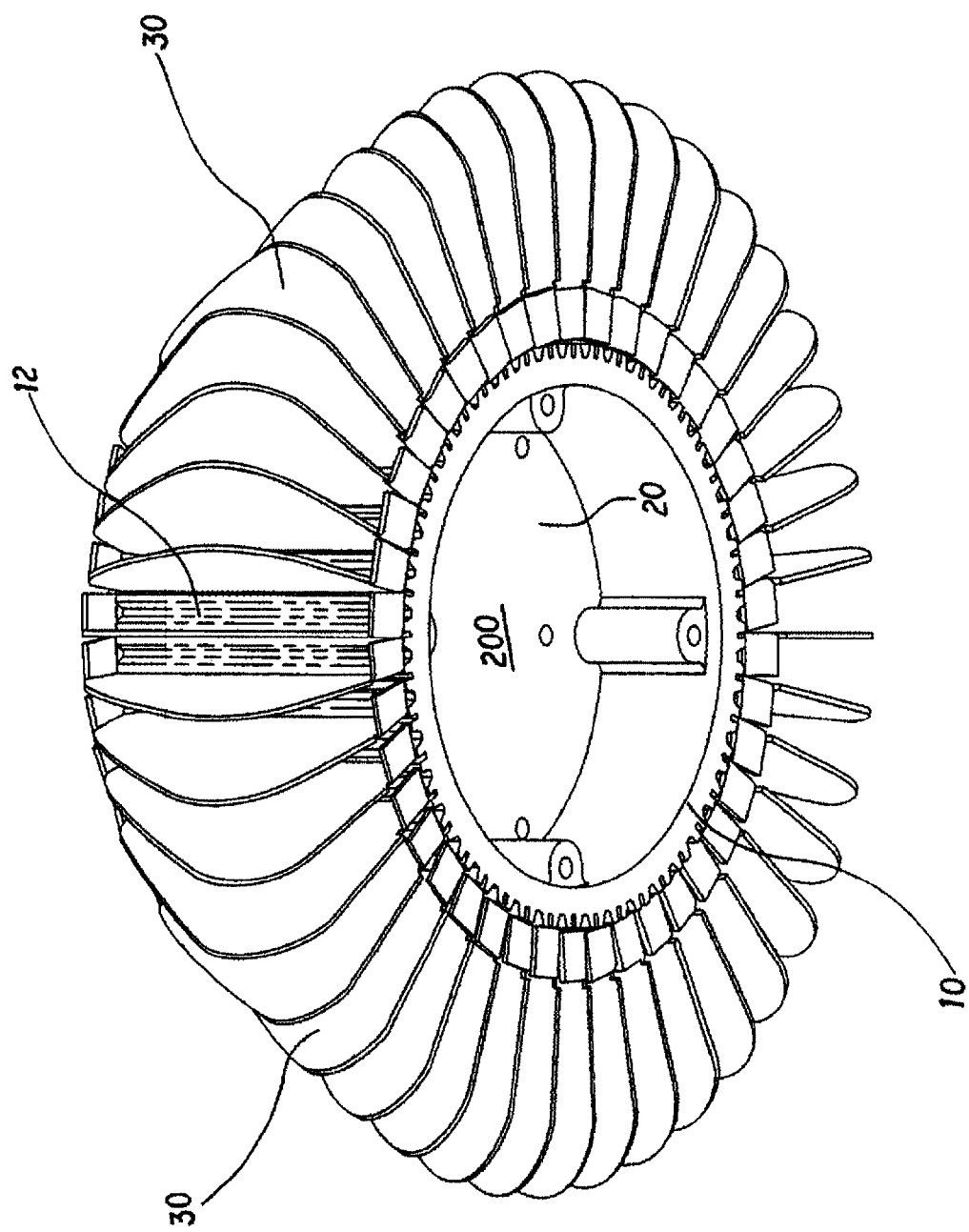
FIG. 8 is a pictorial drawing showing the appearance of a finished product of a ring heat dissipating device of the present invention.
Figure 9:
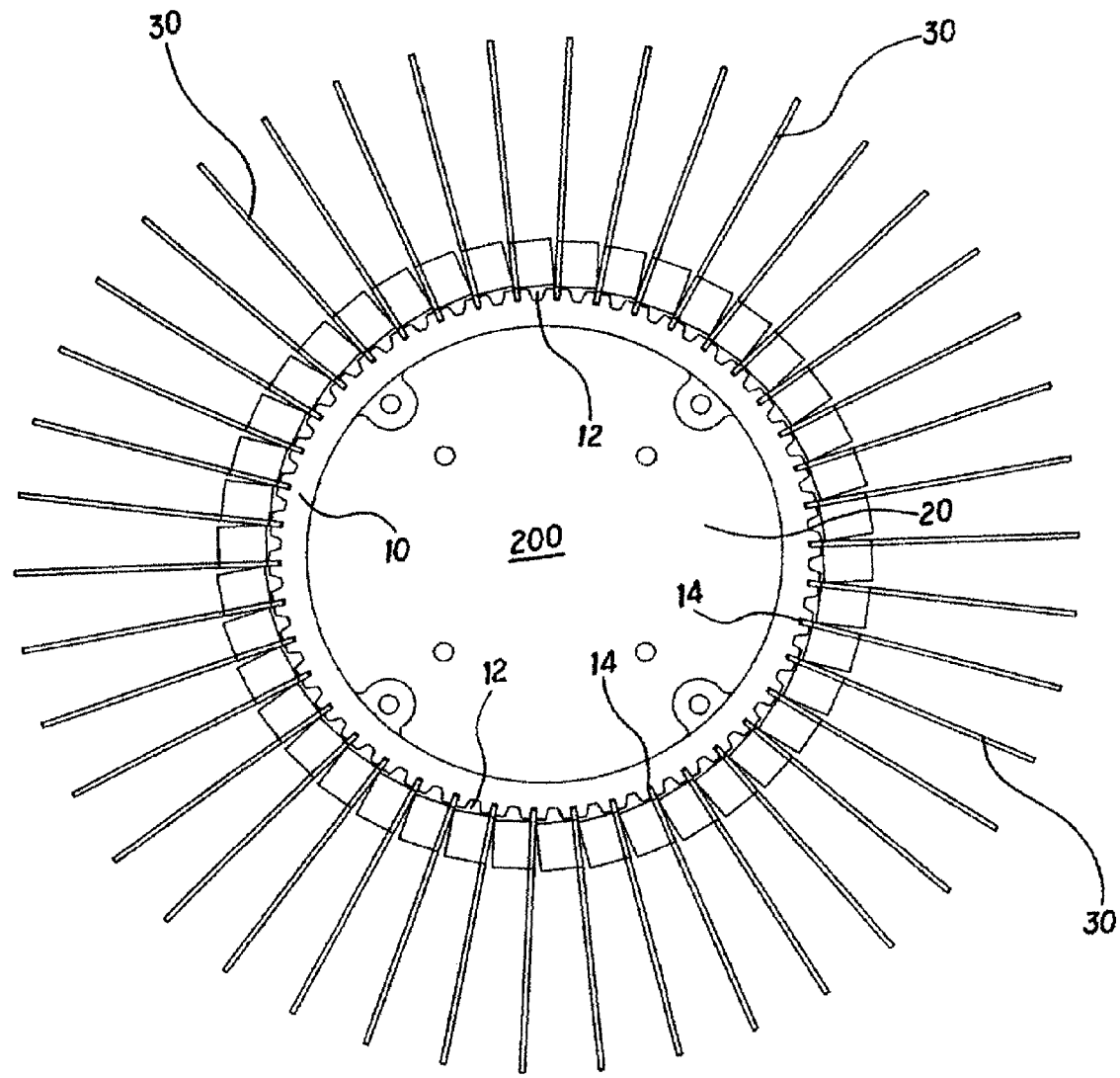
FIG. 9 is a bottom view showing the appearance of the ring heat dissipating device of the present invention.

Referring to FIGS. 3 and 4, the forming process of the ring body 10 and the heat dissipating fins 30 is illustrated. The heat dissipating fins 30 are inserted into the slots 14, the trench 12 is punched by a punch 40 so as to rivet the slots 14 and the heat dissipating fins 30 beside the punched trench 12. A further description is described in the following in accordance with FIGS. 3 to 5. As shown in FIG. 3, the heat dissipating fins 30 are arranged on the outer surface of the ring body 10 and being inserted into the slots 14. After the punch 40 punches the trench 12, as shown in FIGS. 4 and 5, the trenches 12 are deformed and the heat dissipating fins 30 are tightly riveted by the deformed trenches 12 on two sides of the heat dissipating fins 30. Thus, the ring body 10 and the heat dissipating fins 30 are tightly combined together (as shown in FIGS. 8 and 9).

Figure 6:
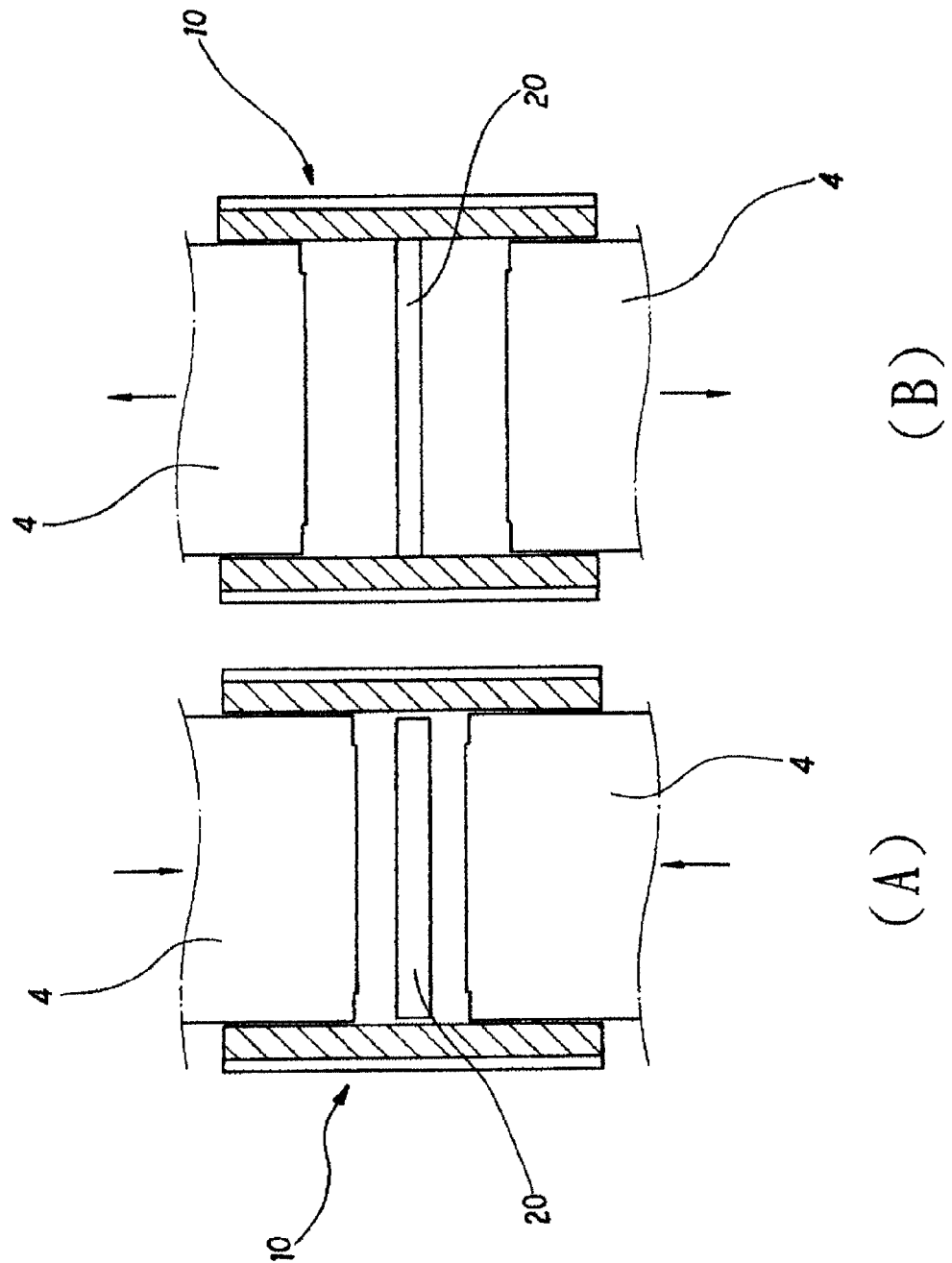
FIGS. 6A and 6B are schematic views showing the punching process of the bottom plate and the ring body.
Figure 7:
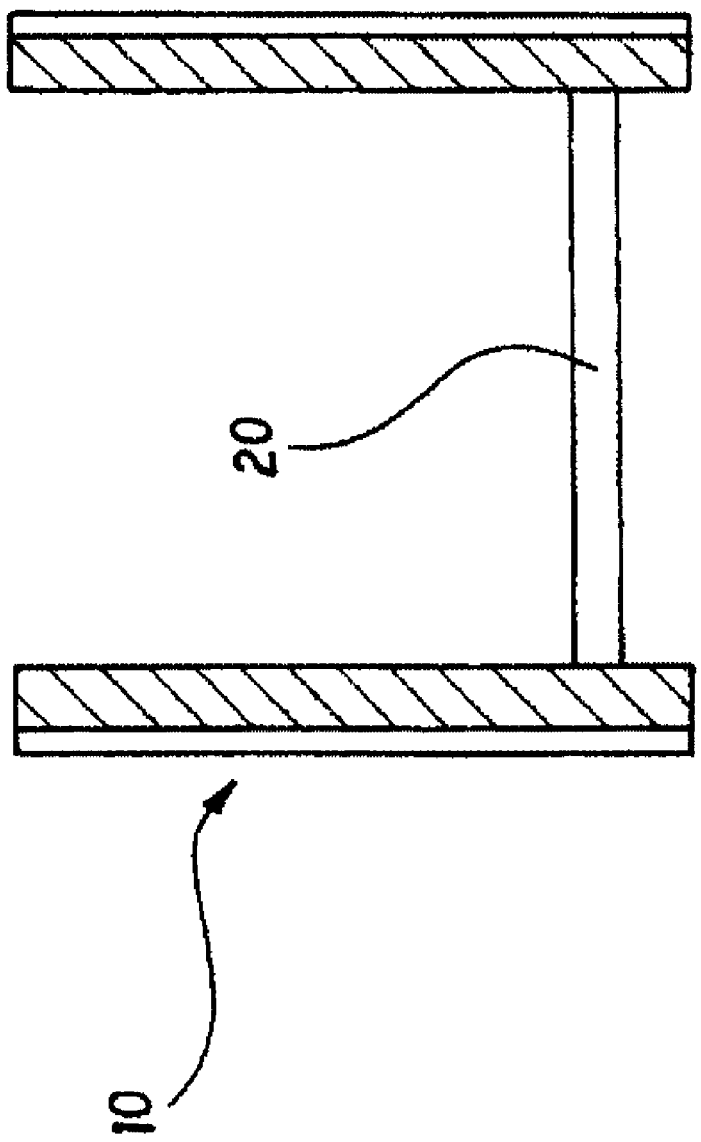
FIG. 7 is a schematic view showing the bottom plate being fixed to another predetermined position.

Moreover, the bottom plate 20 loosely arranged inside the ring body 10 as shown in FIG. 6A is punched by the mold 4 so that the bottom plate 20 is fixed to a predetermined position inside the ring body 10 as shown in FIG. 6B. For example, the bottom plate 20 is fixed at a middle position inside the ring body 10 or at a front (as shown in FIG. 7) or rear positions. The punching process is simple and a firm product is finished as shown in FIG. 8. The ring body 10, bottom plate 20, and the heat dissipating fins 30 are thus tightly combined together and a space 200 for placing an electronic device is formed within the bottom plate 20 and the ring body 10.

The ring body 10 and the heat dissipating fins 30 can be made of different materials such as iron, copper, aluminum or alloys of above materials so as to meet a certain condition of heat dissipating. The riveting process is also successfully with such material or alloy of proper malleability for extending and forming under a certain stress.

Figure 10:
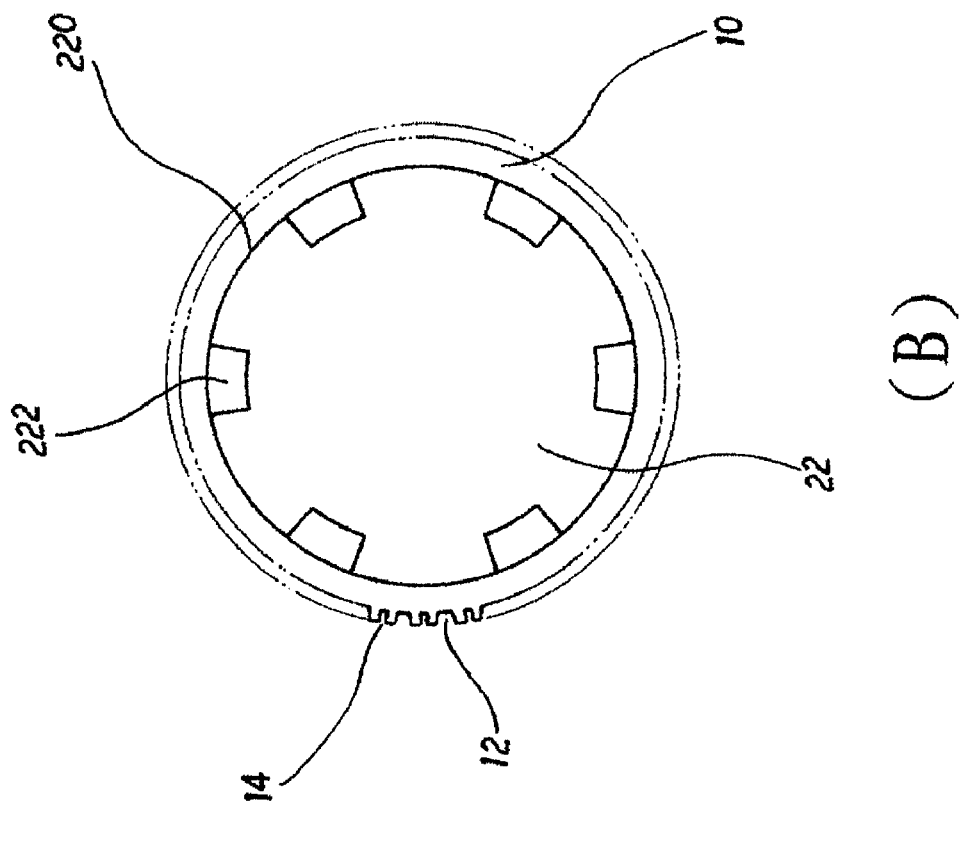
FIGS. 10A and 10B are top views showing another type of bottom plate of the present invention.
Figure 10:
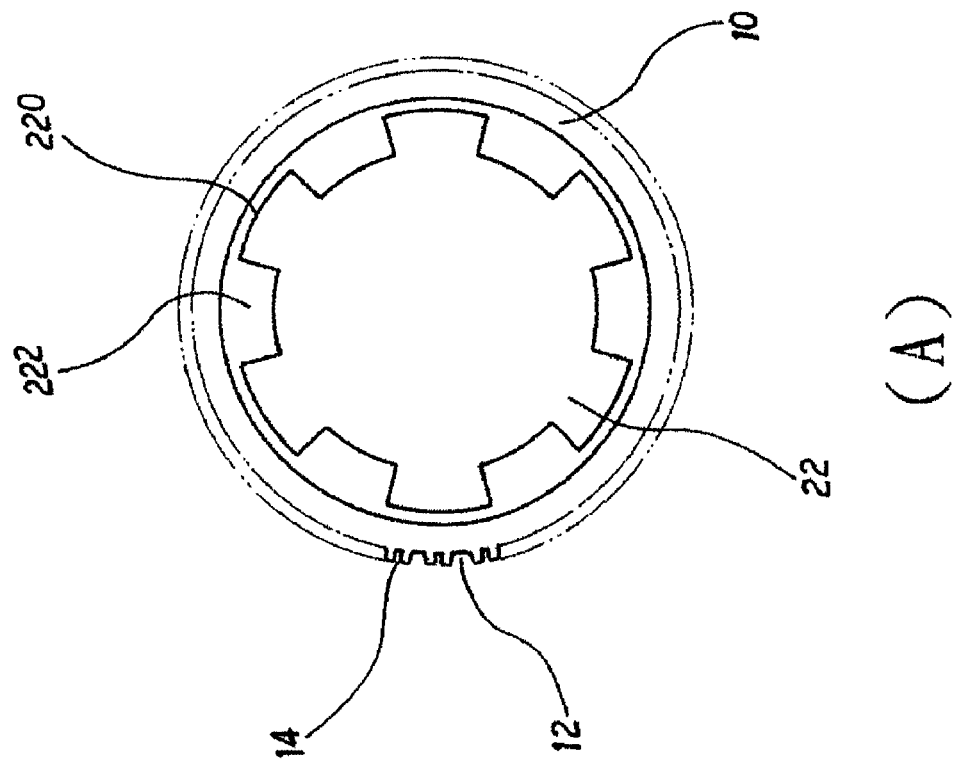
Figure 11:
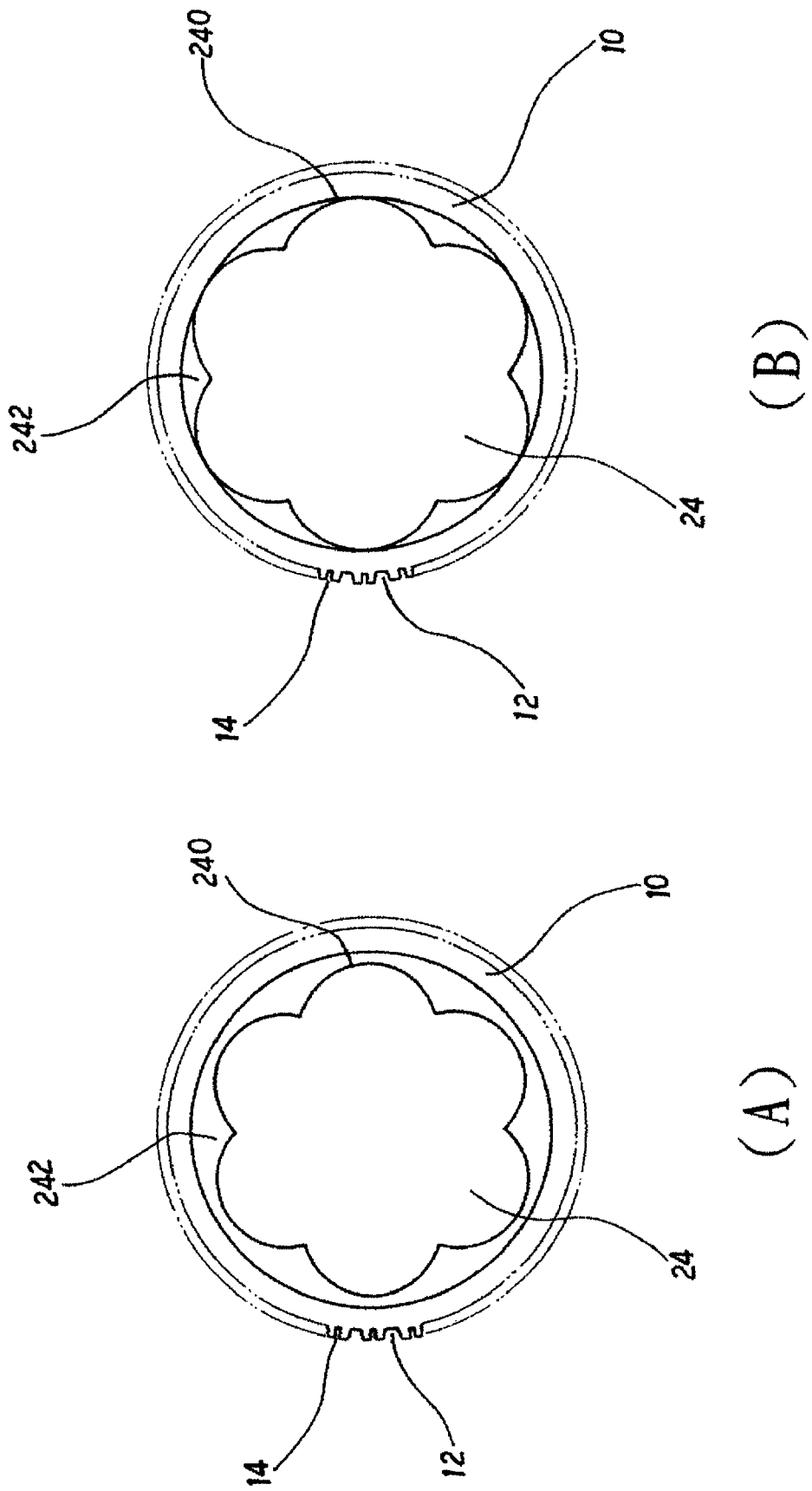
FIGS. 11A and 11B are top views showing another design of the bottom plate of the present invention.

An edge of the bottom plate according to the present invention can be fixed to the ring body without entire contact. A bottom plate 22 with regular or irregular edge as shown in FIG. 10A is punched so that protruding edges 220 are fixed to the ring body 10 of trenches 12 and slots 14 as shown in FIG. 10B. Another embodiment of a bottom plate 24 with arc or petal edges 240 is punched so that the arc or petal edges 240 are fixed to the ring body 10 of trenches 12 and slots 14 as shown in FIG. 11B. Gaps 222 and 242 remain inside the assemblies of the ring bodies 10 and bottom plates 22 and 24.

Electronic devices can be placed on the bottom plates 22 and 24, the heat dissipating effect will be improved by the air convection through the gaps.

Figure 12:
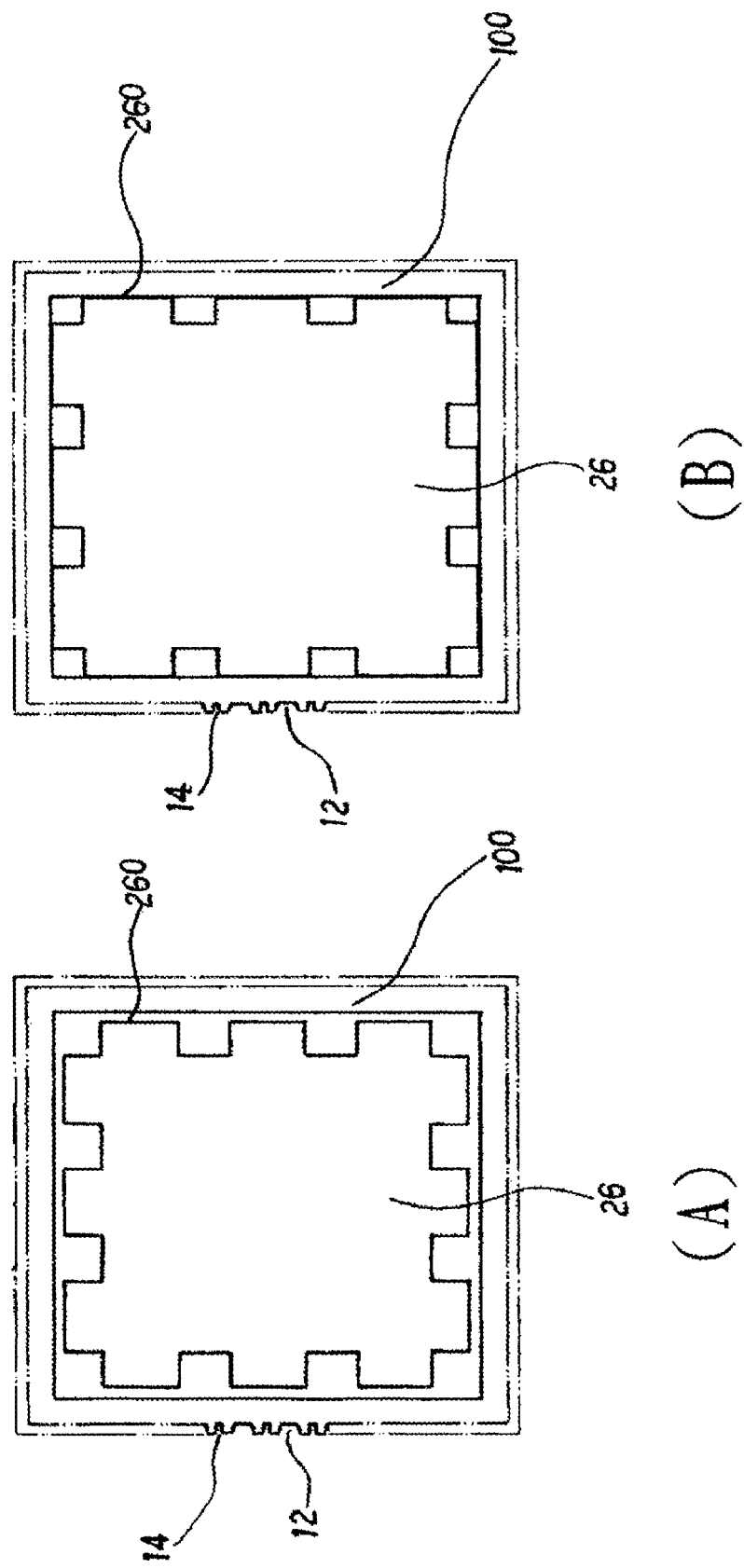
FIGS. 12A and 12B are top views showing another design of the ring body of the present invention.
Figure 13:
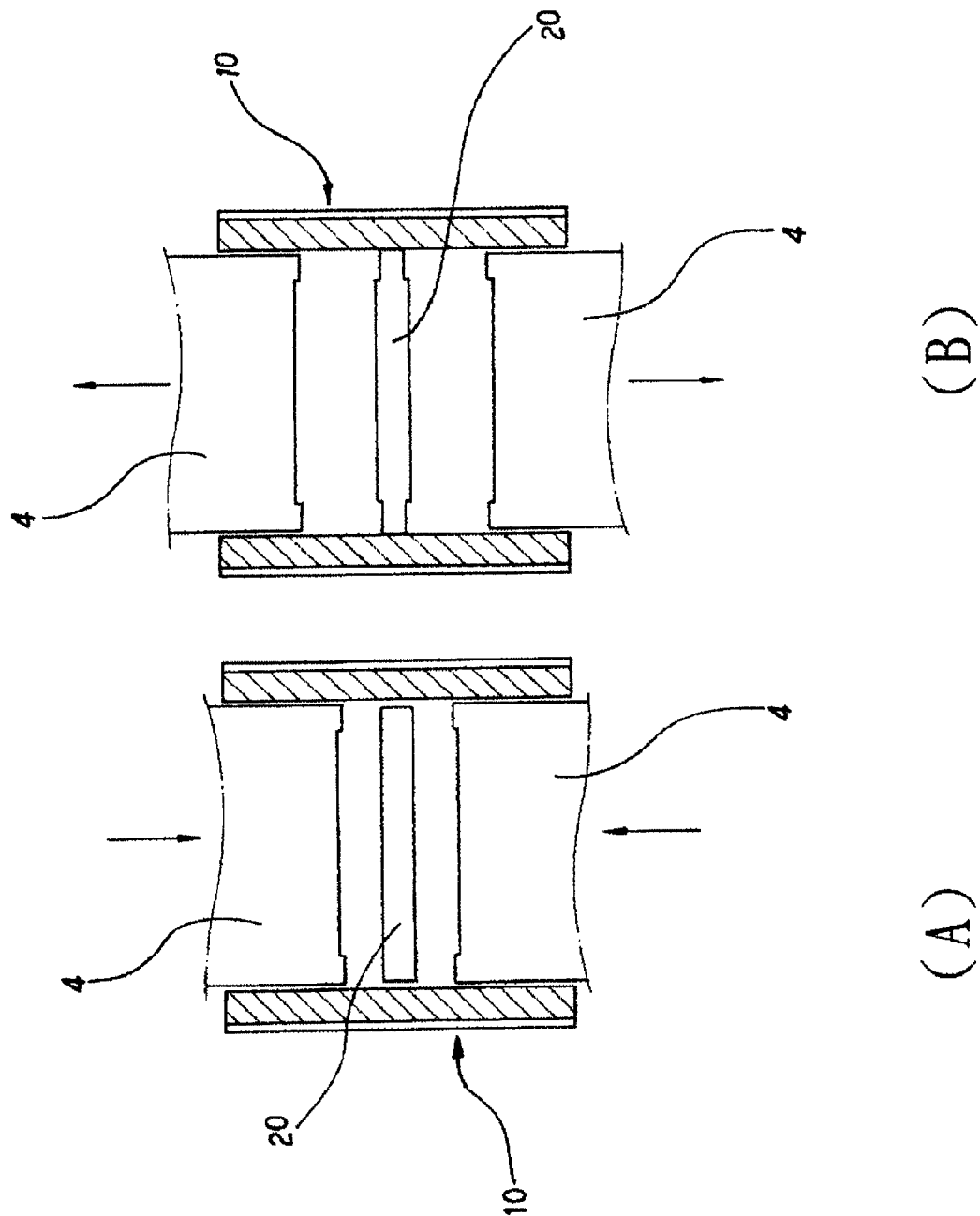
FIGS. 13A and 13B are schematic views showing a punching process of the bottom plate and the ring body in another embodiment of the present invention.
Figure 14:
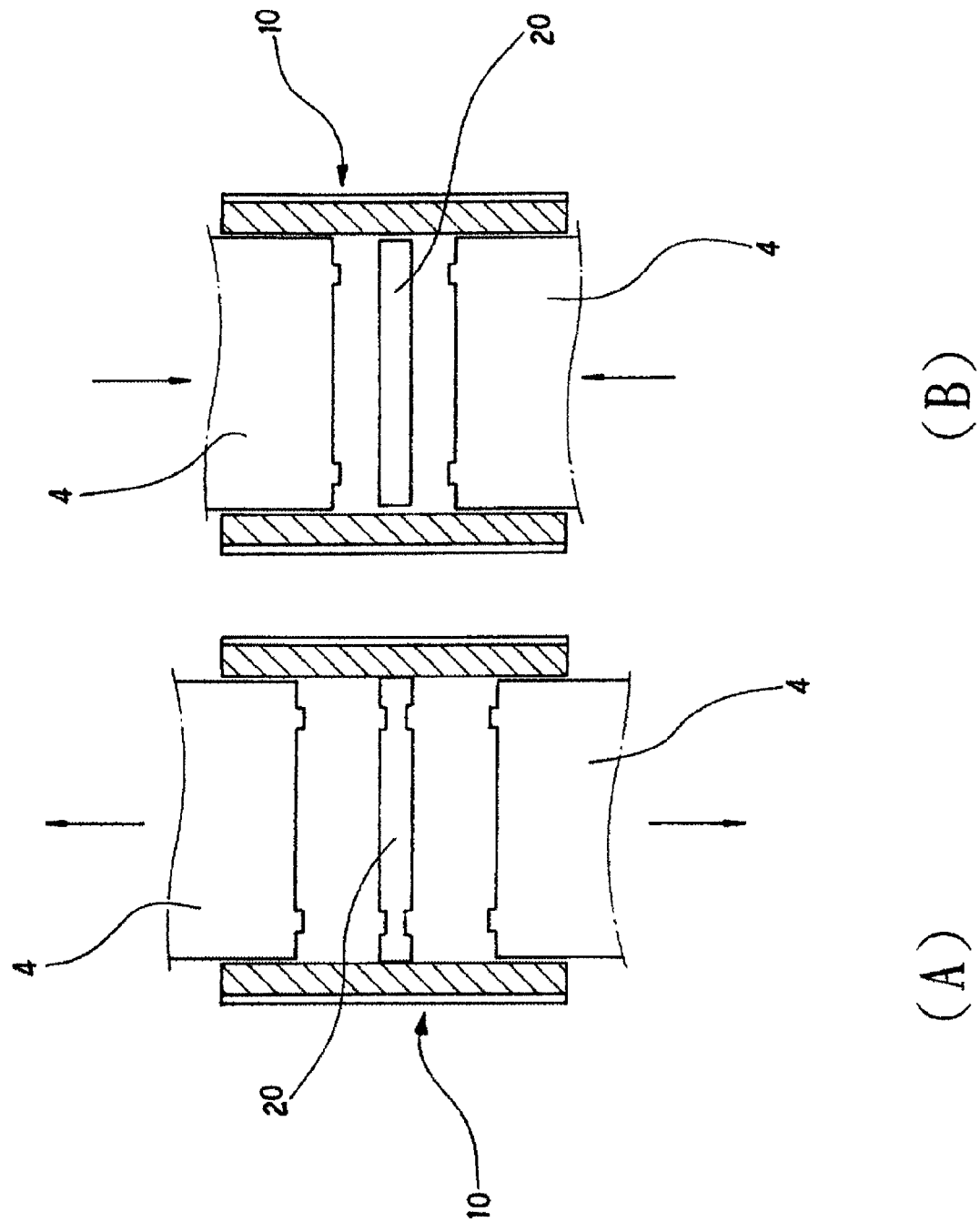
FIGS. 14A and 14B are schematic views showing a punching process of the bottom plate and the ring body in another embodiment of the present invention.

Besides, as shown in FIGS. 12A and 12B, the ring body 10 of above embodiment can be replaced by a square body 100 with the same function and the trenches 12 and slots 14. A square bottom plate 26 with regular or irregular edge 260 can be punched to fix to an inner surface of the square body 100. Moreover, various appearances can be applied to the ring body to meet the special requirements such as circle, semicircle, ellipse, tetragon, polygon, cone, geometric body, or irregular body. With a corresponding bottom plate, various appearances of the present invention can be chosen to meet special needs.

Moreover, referring to FIGS. 13A, 13B, 14A, and 14B, punching processes of the bottom plate 20 and the ring body 10 according to the present invention are illustrated. The bottom plate 20 is punched by the mold 4 only at edge or near the edge thereof so as to fix the bottom plate 20 to the ring body 10. Such punching process will lower the stress applied to the bottom plate 20 from the mold 4 so that the process will be faster and easier.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A ring heat dissipating device formed by punching and riveting through a shaping mold, the ring heat dissipating device comprising:
    a hollow ring body with a plurality of trenches and slots formed alternatively on an outer surface thereof;
    a plurality of fins respectively received in the slots, so that each fin is located between two trenches; and
    bottom plate arranged inside the ring body, wherein the bottom plate is an individual piece with a diameter slightly smaller than an inner diameter of the ring body before being installed inside the ring body;
    wherein the bottom plate with a first thickness before being arranged inside the ring body is extruded to deform with a second thickness to be fixed inside the ring body, and the first thickness is greater than the second thickness, so that the ring body and the bottom plate are tightly combined together,
    wherein the bottom plate has arc or petal edges in contact with an inner wall of the ring body and a plurality of gaps are formed between the bottom plate and the inner wall to provide air convention therethrough.

2. The ring heat dissipating device as claimed in claim 1, wherein a space is formed within the bottom plate and the ring body for placing a heat-generating electronic device.

3. The ring heat dissipating device as claimed in claim 1, wherein the ring body is made of material chosen from a group including iron, copper, aluminum and alloys thereof.

4. The ring heat dissipating device as claimed in claim 1, wherein the ring body is shaped as one of circle, semicircle, ellipse, tetragon, polygon, and cone.

5. The ring heat dissipating device as claimed in claim 1, wherein the bottom plate is made of a metal chosen from a group including copper, aluminum and iron.

* * * * *